United States Patent
Pugliesi-Conti

(10) Patent No.: US 9,746,519 B2
(45) Date of Patent: Aug. 29, 2017

(54) CIRCUIT FOR SECURING SCAN CHAIN DATA

(75) Inventor: Paul-Henri Pugliesi-Conti, Hermanville sur Mer (FR)

(73) Assignee: NXP B.V., Eindhoven (NL)

( * ) Notice: Subject to any disclaimer, the term of this patent is extended or adjusted under 35 U.S.C. 154(b) by 1101 days.

(21) Appl. No.: 13/072,133

(22) Filed: Mar. 25, 2011

(65) Prior Publication Data

US 2012/0246528 A1 Sep. 27, 2012

(51) Int. Cl.
| | | |
|---|---|---|
| G01R 31/3177 | (2006.01) | |
| G06F 11/25 | (2006.01) | |
| G06F 11/00 | (2006.01) | |
| G01R 31/3185 | (2006.01) | |

(52) U.S. Cl.
CPC .......................... G01R 31/318588 (2013.01)

(58) Field of Classification Search
None
See application file for complete search history.

(56) References Cited

U.S. PATENT DOCUMENTS

| | | | | |
|---|---|---|---|---|
| 5,357,572 | A * | 10/1994 | Bianco et al. | 713/193 |
| 7,478,293 | B2 * | 1/2009 | Bancel et al. | 714/724 |
| 7,487,418 | B2 * | 2/2009 | Kayukawa et al. | 714/727 |
| 7,490,231 | B2 * | 2/2009 | Turner et al. | 713/1 |
| 7,620,864 | B2 * | 11/2009 | Elliott | 714/726 |
| 7,725,788 | B2 * | 5/2010 | Tkacik et al. | 714/726 |
| 7,761,759 | B2 * | 7/2010 | Yamazaki | 714/726 |
| 7,949,866 | B2 * | 5/2011 | Watt et al. | 713/100 |
| 2004/0133832 | A1 * | 7/2004 | Williams et al. | 714/726 |
| 2007/0033463 | A1 * | 2/2007 | Bancel et al. | 714/726 |
| 2008/0082879 | A1 * | 4/2008 | Guettaf | 714/727 |

FOREIGN PATENT DOCUMENTS

| | | |
|---|---|---|
| CN | 101021885 A | 8/2007 |
| EP | 1439398 A1 | 7/2004 |
| JP | 2006064395 A | 3/2006 |

OTHER PUBLICATIONS

Gomulkiewicz, Marcin, Maciej Nikodem, and Tadeusz Tomczak. "Low-cost and universal secure scan: a design-architecture for crypto chips." Dependability of Computer Systems, 2006. DepCos-RELCOMEX'06. International Conference on. IEEE, 2006.

Hely, David, et al. "Scan Design and Secure Chips: Can They Work Together." SAME'05: Sophia-Antipolis Forum on MicroElectronics. 2005.

Hély, David, et al. "A secure scan design methodology." Proceedings of the conference on Design, automation and test in Europe: Proceedings. European Design and Automation Association, 2006.

* cited by examiner

*Primary Examiner* — Justin R Knapp

(57) ABSTRACT

Methods, devices and circuits are provided for protecting secure data from being read during a scan chain output. A plurality of scan flip-flops is coupled in a scan chain, and an input circuit is configured to shift input data to the scan flip-flops. A protection circuit is coupled to the scan flip-flops, and the protection circuit configured to detect scan-in of data from the input circuit to a designated one of the scan flip-flops. Scan-out of data from the designated scan flip-flop is enabled in response to detection of a scan-in of data from the input circuit to the designated scan flip-flop. Scan-out of data from the designated scan flip-flop is prevented in response to no detection of scan-in of data from the input circuit to the designated scan flip-flop.

19 Claims, 4 Drawing Sheets

CIRCUIT FOR SECURING SCAN CHAIN DATA

Aspects of the present disclosure are directed toward data security for scan chains. In certain embodiments, the scan chain is configured to ensure that selected data in the scan chain is made inaccessible.

A scan chain technique is often used for testing an integrated circuit (IC) having logic circuits. During a test, the logic is switched to a test mode in which flip-flops are temporarily disconnected from their operational inputs and switched to form a continuous shift register. A test input pattern is entered through the shift register, so that each individual flip-flop receives a respective bit of the test pattern.

In one type of test, the flip-flops are tested for faults (e.g., stuck-at faults) by shifting a particular pattern through all the flip-flops in the scan chain and verifying whether or not the particular pattern appears at the output of the scan chain. In another type of test, after having shifted-in test input data, the registers are then switched back to normal operational inputs and outputs for one or more clock cycles in order to capture the response of logic circuits to the test pattern in the registers. Subsequently, the registers are again switched to form a shift register through which the captured response of the logic circuit is extracted.

An IC having scan chains may be prone to attacks that are aimed at discovering sensitive data stored in the registers of the circuit. Such sensitive data may include decryption keys or other data intended to be kept secret. In one mode of attack, the attacker operates the IC in a normal functional mode and then switches the IC to a scan-out mode. The data are then shifted out of the IC, thereby yielding the sensitive data. Embodiments of the present disclosure relate to data security for scan chains that can be configured to prevent a protected data from being read during use of a scan chain.

Consistent with one embodiment of the present disclosure, a method of protecting data in a scan chain includes scanning-in data as data are being scanned out from the scan chain. The scan chain is monitored for scan-in of data from an initial scan flip-flop in the scan chain to a designated scan flip-flop in the scan chain. In response to no detection of scan-in of data from the initial scan flip-flop to the designated scan flip-flop, scan-out of data from the designated scan flip-flop is blocked. In response to detecting scan-in of data from the initial scan flip-flop to the designated scan flip-flop, scan-out of data from the designated scan flip-flop is enabled. Thus, the method provides for blocking the scan-out of sensitive data from the scan chain until the scan flip-flops that were occupied by the sensitive data ("secure flip-flops") no longer have sensitive data stored therein. Various approaches may be used to determine when the secure flip-flops no longer have sensitive data. In one embodiment, a particular code having been shifted through the secure flip-flops will signal that blocking of sensitive data may cease. In another embodiment, the number of shifts may be counted to ensure that non-secure data have been shifted into the secure flip-flops. The blocking of sensitive data from the scan chain may entail outputting pseudo-random data, outputting a constant stream of logic 0s, or outputting a constant stream of logic 1s.

In another embodiment, a circuit is provided for protecting data in a scan chain. The circuit includes a plurality of scan flip-flops coupled in a scan chain. An input circuit is configured to shift input data to the scan flip-flops, and a protection circuit is coupled to the scan flip-flops. The protection circuit is configured to detect a scan-in of data from the input circuit to a designated one of the scan flip-flops. The protection circuit enables scan-out of data from the designated scan flip-flop in response to detection of scan-in of data from the input circuit to the designated scan flip-flop. The protection circuit prevents scan-out of data from the designated scan flip-flop in response to not detecting scan-in of data from the input circuit to the designated scan flip-flop.

A circuit for protecting data in a scan chain, in another embodiment, includes a plurality of intermediate scan flip-flops directly coupled between two scan flip-flops in the scan chain. A detector circuit is coupled to the intermediate scan flip-flops. The detector circuit detects a particular value scanned-in to the intermediate scan flip-flops. The detector circuit generates an enable signal in a first state in response to detection of the particular value and generates the enable signal in a second state in response to no detection of the particular value. A data blocker circuit is coupled to the detector circuit and to the intermediate scan flip-flops. The data blocker circuit enables shifting out of data from the intermediate scan flip-flops in response to the enable signal being in the first state. In response to the enable signal being in the second state, the data blocker circuit blocks shifting out of data from the intermediate scan flip-flops.

The above discussion is not intended to describe each embodiment or every implementation. The figures and following description also explicitly describe various embodiments and other embodiments, modifications, equivalents, and alternatives falling within the spirit and scope of the disclosure. Various example embodiments may be more completely understood in consideration of the following detailed description in connection with the accompanying drawings, in which.

Figure 1:
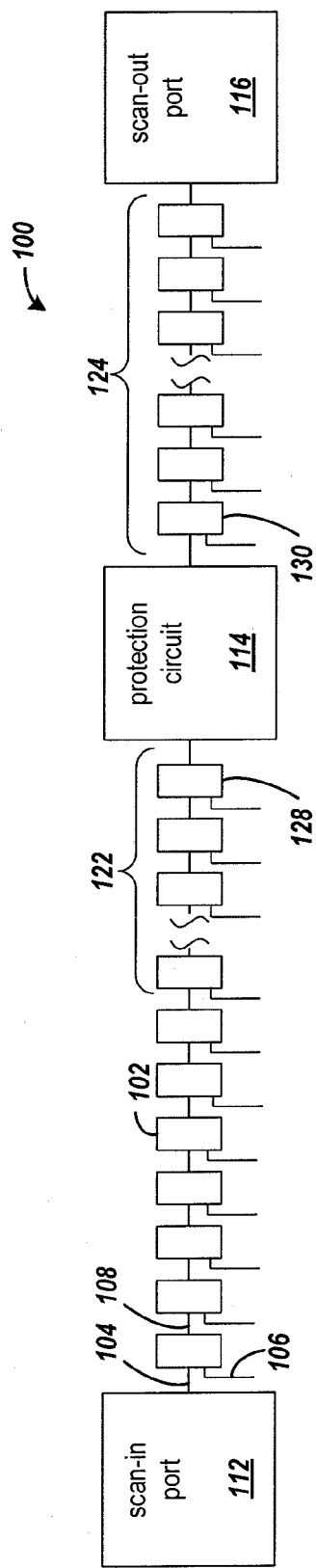
FIG. 1 shows a scan chain circuit having a protection circuit for protecting against unauthorized accessing of sensitive data in the scan chain registers.

While the disclosure is amenable to various modifications and alternative forms, examples thereof have been shown by way of example in the drawings and will be described in detail. It should be understood, however, that the intention is not to limit the disclosure to the particular embodiments shown and/or described. On the contrary, the intention is to cover all modifications, equivalents, and alternatives falling within the spirit and scope of the disclosure.

The disclosed embodiments are believed to be applicable to a variety of different types of processes, devices, and arrangements for use with various different systems and devices. While the embodiments are not necessarily so limited, various aspects of the disclosure may be appreciated through a discussion of examples using this context.

Consistent with one or more embodiments, sensitive data in scan flip-flops of a scan chain are protected by ensuring that the sensitive data cannot be scanned out during a scan test. In order to protect the sensitive data, a circuit monitors the data scanned-in to the scan chain and blocks the sensitive data from being scanned-out. Once non-secure data occupies the secure flip-flops, scan-out of data in the secure flip-flops is enabled. Thus, the blocking of the sensitive data prevents a party from scanning-out the sensitive data from the scan chain.

FIG. 1 shows a scan chain circuit 100 having a protection circuit for protecting against unauthorized accessing of sensitive data in the scan chain registers. The scan chain circuit includes a plurality of scan flip-flops, for example, scan flip-flop 102, connected as a scan chain. Each scan flip-flop includes a scan-in pin, a data-in pin, and a data-out pin, which are shown as being connected to lines 104, 106, and 108, respectively, for an example one of the scan flip-flops. Signal lines connected to the clock and test-enable pins of the scan flip-flop are not shown for ease of illustration. During a scan test, each scan flip-flop 102 inputs data at the scan-in pin from the previous scan flip-flop in the scan chain. During normal operating mode, each scan flip-flop inputs data at the data-in pin according to the application logic (not shown) to which the scan flip-flop is connected.

The circuit 100 further includes a scan-in port 112, a protection circuit 114, and a scan-out port 116. The scan-in port includes the circuitry through which scan-in data is input to the scan chain and may also include the circuitry for controlling scan-test enable and scan-test reset signals to the scan flip-flops 102. The scan-out port includes the circuitry through which data from the scan chain are shifted out from the device.

The protection circuit 114 controls whether or not sensitive data in the scan chain can be scanned-out. The sensitive data that is to be protected will occupy certain ones of the scan flip-flops prior to any shifting that will occur during a scan-out. For purposes of illustration, the sensitive data occupy a contiguous set of scan flip-flops 122, for example. If sensitive data occupy scan flip-flops 122 prior to initiating scan-out, the protection circuit 114 blocks the sensitive data from being shifted to scan flip-flops 124, and thereby prevents the sensitive data from being shifted-out via scan-out port 116.

When scan-out is initiated, the protection circuit monitors the data being scanned-in. In one embodiment, the protection circuit 114 continues to block data shifted from scan flip-flops 122 until non-secure data occupies the scan flip-flops formerly occupied by the sensitive data. That is, until data which have been input at the scan-in port occupies the scan flip-flops 122 formerly having the secure data, or in the alternative the protection circuit 114 detects a particular sequence of bit values, the protection circuit 114 continues to block data shifted from the scan flip-flops 122. Once the protection circuit determines that non-secure data occupies the scan flip-flops formerly occupied by the sensitive data, the protection circuit enables scan-out of data from the scan flip-flops 122. By the time that the protection circuit enables scan-out of data from the scan flip-flops 122, the sensitive data will have been shifted out of the scan flip-flops 122 and blocked from progressing to scan flip-flops 124 in the scan chain.

In one embodiment, the protection circuit 114 is directly coupled between two of the scan flip-flops in the scan chain. For example, the protection circuit receives shifted data from scan flip-flop 128 and provides data to scan flip-flop 130. Whether or not the protection circuit blocks the data from scan flip-flop 128 from being shifted to scan flip-flop 130 depends on whether newly scanned-in data has progressed to the scan flip-flops 122.

In one embodiment, the protection circuit 114 may be easily integrated into a scan chain design as a module that is connected between two of the scan flip-flops in the circuit design. The point in the scan chain at which the protection circuit is connected depends on which scan flip-flops in the scan chain have sensitive data. Since the protection circuit selectively blocks data from being shifted out from the protection circuit, the protection circuit may be connected in the scan chain after the last scan flip-flop having the sensitive data. For example, in FIG. 1, if scan flip-flops 122 have the sensitive data, the protection circuit is connected after scan flip-flop 128, which is the last scan flip-flop having the sensitive data. In an embodiment in which the protection circuit is connected between two scan flip-flops in the scan chain, data that are present in the scan flip-flops following the protection circuit in the scan chain and before commencing the scan-out will not be protected.

Figure 2:
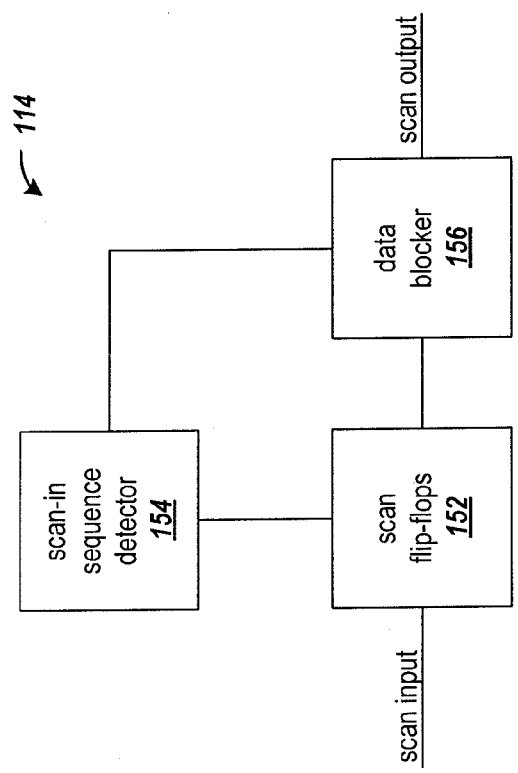
FIG. 2 shows a protection circuit in accordance with one embodiment.

FIG. 2 shows a protection circuit 114 in accordance with one embodiment. The protection circuit includes a set of intermediate scan flip-flops 152, a scan-in sequence detector circuit 154, and a data blocker circuit 156. Data from the scan chain are shifted-in to the intermediate scan flip-flops 152. The detector circuit 154 monitors the shifted-in data for an enabling sequence of scan data. In one embodiment, the enabling sequence may be a quantity of data that is sufficient to cause the sensitive data to be shifted out of the scan flip-flops in the scan chain (e.g., scan flip-flops 122) and blocked by data blocker circuit 156. The quantity of data may be detected by counting the number of shifts of data in the scan chain. In another embodiment, the enabling sequence may be a particular sequence of bit values shifted-in to the intermediate scan flip-flops 152. Detection of the sequence indicates that a scan-in of data from the input circuit to a designated scan flip-flop has occurred. Once the sequence is detected, the detector circuit 154 generates an enable signal having a state that indicates the desired sequence has been detected.

The data blocker 156 shifts-in data from the scan flip-flops 152 and blocks scan data from being shifted out of the data blocker until the scan-in sequence detector circuit 154 signals with the enable signal that the shifted data no longer needs to be blocked. In one embodiment, the data blocker circuit blocks data by outputting a pseudo-random sequence of bit values. In another embodiment, the data blocker circuit blocks data by outputting a stream of all logic 0s, all logic 1s, or alternating logic 0 and logic 1.

Figure 3:
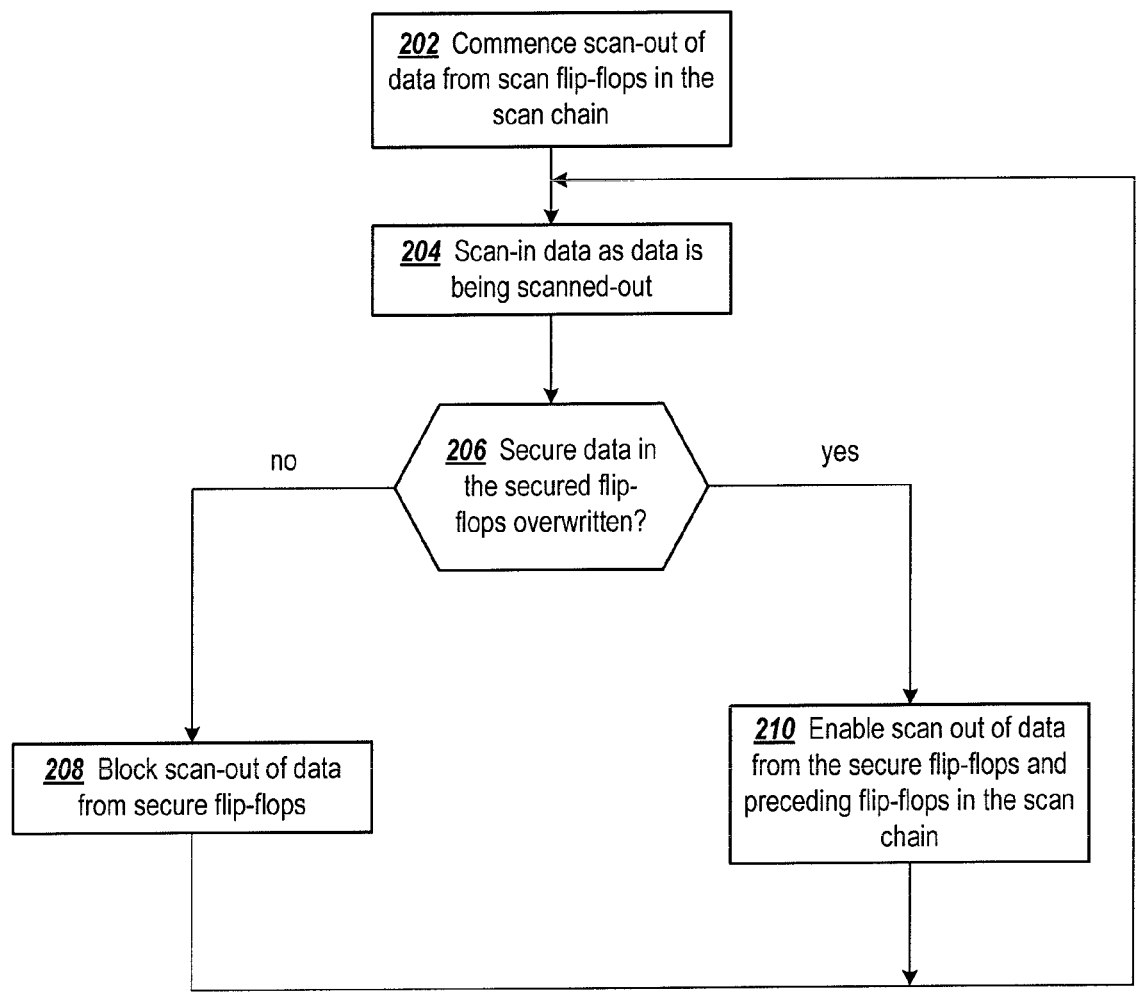
FIG. 3 is a flowchart of an example method for protecting against unauthorized accessing of sensitive data in a scan chain.

FIG. 3 is a flowchart of an example method for protecting against unauthorized accessing of sensitive data in a scan chain. Scan-out of data from the scan chain commences at block 202. As data are scanned-out from the end of the scan chain, data are scanned-in at the front or input side of the scan chain at block 204. At decision block 206, the process determines whether to block or enable output of data from secure flip-flops in the scan chain. The secure flip-flops are those that contain sensitive data which the application user or designer does not want to be discovered by an unauthorized party.

If the secure data in the secure scan flip-flops has not yet been overwritten with shifted-in data, the process blocks scan-out of data from the secure flip-flops at block 208. The blocking of scan-out data may be by way of outputting data that have been shifted through a linear feedback shift register (LFSR) to produce a pseudo-random sequence of logic values, for example. Once the process detects that the sensitive data have been overwritten in the secure flip-flops, the process enables scan-out of data from the secure flip-flops at block 210. The detection of the sensitive data having been overwritten may be determined by counting shifts of data in the scan chain or by detecting when a particular sequence has been scanned-in and shifted to at least a designated scan flip-flop in the scan chain. Scanning-in of data continues at block 204.

Figure 4:
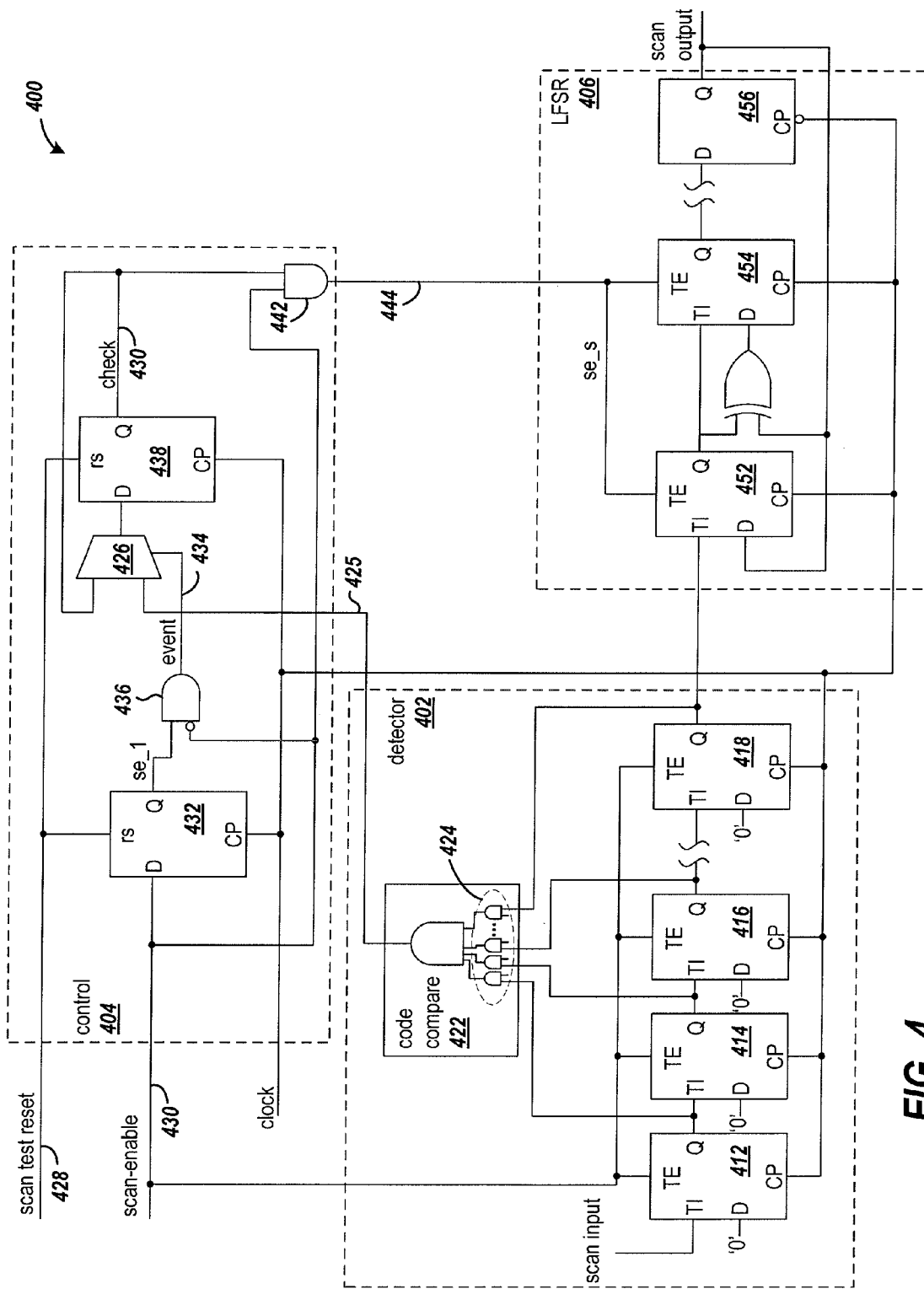
FIG. 4 is a schematic diagram of a protection circuit according to one embodiment.

FIG. 4 is a detailed schematic diagram of a protection circuit 400 according to one embodiment. The protection circuit includes three main sections, including a detector circuit 402, a control circuit 404, and an LFSR circuit 406. Until a particular sequence of bits in the scan chain is detected by the detector circuit, the LFSR generates a pseudo-random sequence of bit values from scan chain data shifted-in to the LFSR. When the particular sequence of bits is detected by the detector, the detector signals the control circuit that the sequence of bits has progressed in the scan chain to the protection circuit. In response, the control circuit signals the LFSR circuit that shifted scan data may be output, which causes the LFSR circuit to shift-out scan data instead of LFSR data, which is generated from the shifted data from the scan chain.

The detector circuit includes a plurality of scan flip-flops 412, 414, 416, and 418 that are connected in the scan chain. Each of the scan flip-flops includes a test input pin (TI) for receiving shifted data in the scan chain, a data input pin (D) that is tied to logic 0, a clock pin (CP), a data output pin (Q), and a test enable pin (TE). When the scan-enable signal is asserted to the TE pins of the scan flip-flops, data are shifted in the scan flip-flops, and when the scan-enable signal is deasserted to the TE pins of the scan flip-flops, an initiate value (logic 0 values in FIG. 4) are input to the flip-flops.

The detector circuit 402 also includes a compare circuit 422 that compares output from the scan flip-flops 412, 414, 416, and 418 to a programmed code value. The programmed code value may be hardwired into the application circuit such as with fuses or anti-fuses, or the programmed code may be stored in latches, flip-flops or comparable devices in the application circuit. The bits of the programmed code (not shown) and the output from the scan flip-flops are input to AND gates 424. If all the bits match, a match signal 425 is asserted to an input of multiplexer 426 in the control circuit 404.

The match signal from the detector circuit is input to the multiplexer 426 of the control circuit 404. Scan test reset signal 428 and scan-enable signal 430 are also input to the control circuit 404. The state of scan-enable signal 430 is captured in flip-flop 432. The event signal 434, which is output from AND gate 436 is a delayed version of the scan-enable signal and is used as the select input of multiplexer 426. Flip-flop 438 captures the output of multiplexer 426, which is either the feedback check value 440 from the flip-flop 438 or the match signal 425 from the detector circuit.

The check signal 430 and scan-enable signal 430 are input to AND gate 442, which outputs signal 444 whose state controls whether the LFSR circuit shifts scan data through the flip-flops 452, 454, . . . 456 or shifts LFSR data through the flip-flops. While the enable signal 444 is deasserted, the scan flip-flops 452 and 454 in the LFSR circuit input data on the D input pin, which is the LFSR data. While the enable signal 444 is asserted, the scan flip-flops 452 and 454 input data on the test input pin TI, which is the data shifted through the scan chain. Thus, the LFSR blocks shifting-out of scan chain data by outputting LFSR data while the enable signal is deasserted. Once the enable signal is asserted, the LFSR circuit allows the scan chain data to be shifted-out.

It will be appreciated that the number of scan flip-flops in the detector circuit 402 and the number of scan flip-flops in the LFSR circuit will depend on implementation requirements.

Figure 5:
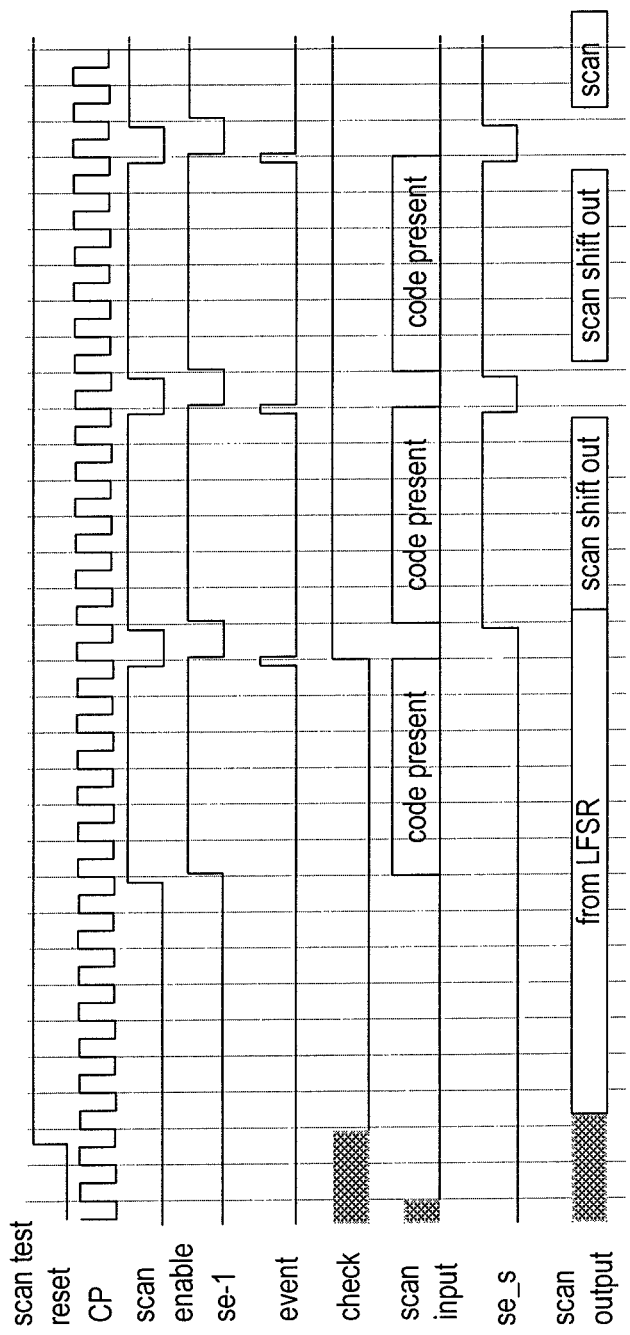
FIG. 5 is a timing diagram showing the relationship between the signals in the circuit diagram of FIG. 4.

FIG. 5 is a timing diagram showing the timing relationships between the signals in the circuit diagram of FIG. 4. The scan test reset signal is asserted when scan-in/out is to commence and is asserted throughout the scan. CP is the clock pulse signal. Signal se_1 is the signal output from flip-flop 432, and the event signal is output from AND gate 436. The check signal is output from flip-flop 438. Scan input corresponds to the scan data shifted-in to scan flip-flop 412, and scan output corresponds to data shifted out of the LFSR circuit 406. The se_s signal corresponds to the enable signal 444 provided from the control circuit 404 to the LFSR circuit 406.

From the scan output it can be seen that data from the LFSR is output until the se_s signal is asserted, which indicates that an erase sequence has completed (e.g., a desired code was detected to be present in the scan flip-flops 412-418 of the detector circuit). The se_s signal is asserted in response to both the scan-enable signal and the check signal being asserted. The check signal is asserted and stays asserted once the event signal is pulsed and the output from the compare circuit 422 detects a match between a shifted in set of bit values and a programmed code (erase sequence detection).

Based upon the above discussion and illustrations, those skilled in the art will readily recognize that various modifications and changes may be made without strictly following the exemplary embodiments and applications illustrated and described herein. For example, the voltage levels and specific circuits are provided by way of example and are not necessarily limiting. Such modifications do not depart from the true spirit and scope of the present disclosure, including that set forth in the following claims.

What is claimed is:

1. A circuit for protecting data in a scan chain, comprising:
a plurality of scan flip-flops coupled in a scan chain;
an input circuit configured to shift input the data to the scan flip-flops;
a protection circuit coupled to the scan flip-flops, the protection circuit configured to:
detect scan-in of the data from the input circuit to a designated one of the scan flip-flops;
enable scan-out of the data from the designated scan flip-flop in response to detection of the scan-in of the data from the input circuit to the designated scan flip-flop; and
disable scan-out of the data from the designated scan flip-flop in response to no detection of scan-in of the data from the input circuit to the designated scan flip-flop, wherein the protection circuit includes a linear feedback shift register (LFSR) configured to shift the data from an output of one of the plurality of scan flip-flops, through scan registers of the LFSR, to an output node in response to scan-out being enabled by the protection circuit, and block shifting out of the data from the one of the plurality of scan flip-flops to the output node in response to scan-out being disabled by the protection circuit.

2. The circuit of claim 1, wherein
the LFSR is block shifting out of the data from the plurality of scan flip-flops to the output node by generating and outputting a pseudo-random sequence of data to the output node; and
the protection circuit is directly coupled between two of the scan flip-flops in the scan chain, and wherein the data input to the scan flip-flops is in one of said two of the scan flip-flops in the scan chain.

3. The circuit of claim 2, wherein the protection circuit includes a plurality of scan flip-flops in the scan chain.

4. The circuit of claim 3, wherein the protection circuit further comprises:
a detector circuit coupled to the plurality of scan flip-flops of the protection circuit, wherein the detector circuit is configured to:
   detect whether or not a scan-in of the data from the input circuit to the designated scan flip-flop has occurred; and
   generate an enable signal having a state that indicates whether or not a scan-in of the data from the input circuit to the designated scan flip-flop has occurred.

5. The circuit of claim 4, wherein the protection circuit further comprises:
a data blocker circuit coupled to the detector circuit and coupled to the plurality of scan flip-flops of the protection circuit, wherein the data blocker is configured to block shifting out of the data from the plurality of scan flip-flops in the protection circuit in response to the enable signal having a state that indicates that a scan-in of the data from the input circuit to the designated scan flip-flop has not occurred.

6. The circuit of claim 4, wherein the linear feedback shift register (LFSR) is coupled to the detector circuit and coupled to the plurality of scan flip-flops of the protection circuit, wherein the LFSR is configured to:
block shifting out of the data from the plurality of scan flip-flops in the protection circuit in response to the enable signal having a state that indicates that a scan-in of the data from the input circuit to the designated scan flip-flop has not occurred; and
shift out the data from the plurality of scan flip-flops in the protection circuit in response to the enable signal having a state that indicates that a scan-in of the data from the input circuit to the designated scan flip-flop has occurred.

7. The circuit of claim 1, wherein:
the protection circuit includes a plurality of scan flip-flops in the scan chain directly coupled between two of the scan flip-flops in the scan chain, and the protection circuit includes:
   a sequence detector configured to detect a particular value scanned-in to the scan flip-flops in the protection circuit and generate an enable signal in a first state in response to detection of the particular value, and generate the enable signal in a second state in response to no detection of the particular value; and
   a data blocker coupled to receive the enable signal from the sequence detector, the data blocker configured to enable shifting out of the data from the scan flip-flops in the protection circuit in response to the enable signal being in the first state, and configured to block shifting out of the data from the scan flip-flops in the protection circuit in response to the enable signal being in the second state.

8. The circuit of claim 7, wherein the linear feedback shift register (LFSR) is coupled to receive the enable signal and coupled to the scan flip-flops of the protection circuit, wherein the LFSR is configured to:
block shifting out of the data from the plurality of scan flip-flops in the protection circuit in response to the enable signal being in the first state; and
shift out the data from the plurality of scan flip-flops in the protection circuit in response to the enable signal being in the second state.

9. The circuit of claim 1, wherein the LFSR includes a set of scan registers, each having a respective data input node, a respective test input node, a respective output node, and a respective test enable node and configured to use the data input node for inputting data when the respective test enable node is set to a first value and use the test input node for inputting data when the respective test enable node is set to a second value.

10. The circuit of claim 9, wherein the set of scan registers are interconnected to form a shift register when the test enable nodes are set to the second value, and form a pseudo-random number generator when test enable nodes are set to the first value.

11. A circuit for protecting data in a scan chain, comprising:
a plurality of intermediate scan flip-flops directly coupled between two scan flip-flops in the scan chain;
a detector circuit coupled to the intermediate scan flip-flops, the detector circuit configured to:
   detect a particular value scanned-in to the intermediate scan flip-flops,
   generate an enable signal in a first state in response to detection of the particular value, and
   generate the enable signal in a second state in response to no detection of the particular value; and
a data blocker circuit coupled to the detector circuit and to the intermediate scan flip-flops, the data blocker circuit configured to:
   enable shifting out of data from the intermediate scan flip-flops in response to the enable signal being in the first state, and
   disable shifting out of the data from the intermediate scan flip-flops in response to the enable signal being in the second state, and
a linear feedback shift register (LFSR) coupled to the detector circuit and configured to
   shift the data from an output of one of the plurality of scan flip-flops, through scan registers of the LFSR, to an output node in response to scan-out being enabled by the protection circuit, and
   block shifting out of the data from the one of the plurality of scan flip-flops to the output node in response to scan-out being disabled by the protection circuit.

12. The circuit of claim 11, wherein the LFSR is configured to block the shifting out of the data from the plurality of scan flip-flops to the output node by generating and outputting a pseudo-random sequence of data to the output node.

13. A method of protecting data in a scan chain, comprising:
scanning-in data as the data are being scanned out from the scan chain;
monitoring for a scan-in of the data from an initial scan flip-flop in the scan chain to a designated scan flip-flop in the scan chain;
in response to no detection of scan-in of the data from the initial scan flip-flop to the designated scan flip-flop, disable scan-out of the data from the designated scan flip-flop by setting a linear feedback shift register (LFSR) to prevent the data from being shifted through the LFSR to an output node; and
in response to detection of a scan-in of the data from the initial scan flip-flop to the designated scan flip-flop, enabling scan-out of the data from the designated scan flip-flop by setting the LFSR to shift the data through the LFSR to an output node.

14. The method of claim 13, wherein:
the enabling of scan-out of the data includes shifting the data from the designated scan flip-flop through a plurality of scan flip-flops, and selecting scan-in data to input to the plurality of scan flip-flops in response to detection of scan-in of the data from the initial scan flip-flop to the designated scan flip-flop; and
the disabling of scan-out of the data includes selecting linear feedback data to input to the plurality of scan flip-flops in response to a scan-in of the data from the initial scan flip-flop to the designated scan flip-flop not having been detected.

15. The method of claim 13, further comprising:
shifting the data from the designated scan flip-flop through a plurality of intermediate scan flip-flops; and
the monitoring includes comparing bit values in the intermediate scan flip-flops to a programmed value.

16. The method of claim 15, further comprising:
enabling scan-out of the data from the designated scan flip-flop in response to bit values in the intermediate scan flip-flops being equal to the programmed value; and
blocking scan-out of the data in response to bit values in the intermediate scan flip-flops being not equal to the programmed value.

17. The method of claim 13, wherein the blocking scan-out of the data includes shifting pseudo-random data through the scan chain beginning at the designated scan flip-flop.

18. The method of claim 13, wherein the blocking scan-out of the data includes shifting logic 0 values through the scan chain beginning at the designated scan flip-flop.

19. The method of claim 13, wherein the blocking scan-out of the data includes shifting logic 1 values through the scan chain beginning at the designated scan flip-flop.

* * * * *